United States Patent [19]

Nakai et al.

[11] Patent Number: 5,497,349
[45] Date of Patent: Mar. 5, 1996

[54] DYNAMIC RANDOM ACCESS MEMORY DEVICE HAVING FIRST AND SECOND I/O LINE GROUPS ISOLATED FROM EACH OTHER

[75] Inventors: Kiyoshi Nakai, Ome; Yukihide Suzuki, Akishima; Takashi Inui, Tsuchiura, all of Japan

[73] Assignees: Hitachi, Ltd., Tokyo, Japan; Texas Instruments Incorporated, Dallas, Tex.

[21] Appl. No.: 267,025

[22] Filed: Jun. 21, 1994

[30] Foreign Application Priority Data

Jun. 30, 1993 [JP] Japan .................... 5-187359

[51] Int. Cl.$^6$ .................................................. G11C 7/00
[52] U.S. Cl. .............................. 365/230.03; 365/189.04; 365/230.06
[58] Field of Search ................... 365/230.03, 230.06, 365/189.04

[56] References Cited

U.S. PATENT DOCUMENTS

| | | | |
|---|---|---|---|
| 4,916,700 | 4/1990 | Ito et al. | 365/201 X |
| 4,941,129 | 7/1990 | Oshima et al. | 365/230.03 |
| 4,974,373 | 8/1990 | Yamaguchi et al. | 365/230.03 X |
| 5,029,330 | 7/1991 | Kajigaya | 365/201 |
| 5,043,947 | 8/1991 | Oshima et al. | 365/230.03 |
| 5,301,142 | 4/1994 | Suzuki et al. | 365/51 |
| 5,317,536 | 5/1994 | Aoyama | 365/189.04 |
| 5,369,619 | 11/1994 | Ohba | 365/230.03 |

*Primary Examiner*—Do Hyun Yoo
*Attorney, Agent, or Firm*—Antonelli, Terry, Stout & Kraus

[57] ABSTRACT

A dynamic random access memory device has a memory cell array which includes a first memory cell array part and a second memory cell array part portioned in a first direction parallel with the bit lines, a plurality of column switches, one provided for each of the bit lines, a plurality of input/output lines each connected to different ones of the bit lines via associated ones of the column switches, a row address decoder for decoding a first portion of an address signal and a column address decoder for decoding a second portion of the address signal to thereby simultaneously access at least two memory cells with the address signal. The input/output lines extend in a second direction parallel with word lines and are divided into first and second groups of input/output lines connected to those bit lines which belong to the first and second memory cell array parts, respectively in which the first input/output line group is isolated from the second input/output line group. A first input/output gate circuit is connected to the first group of input/output lines and a second input/output gate circuit is connected to the second group of input/output lines, in which the first and second input/output gate circuits serve to selectively transfer therethrough, between main amplifiers and the first input/output line groups, data to be simultaneously read from or written into the at least two memory cells in the memory cell array.

6 Claims, 7 Drawing Sheets

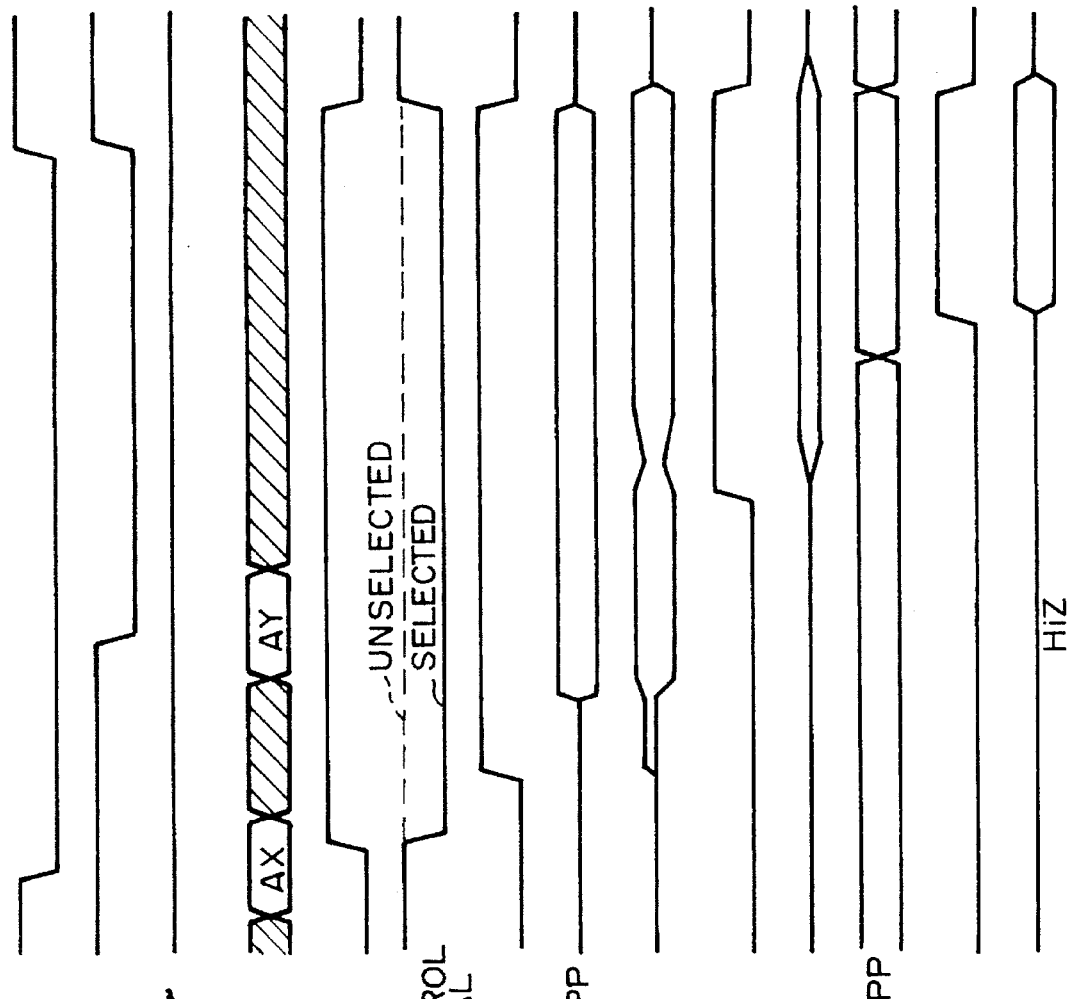

DYNAMIC RANDOM ACCESS MEMORY DEVICE HAVING FIRST AND SECOND I/O LINE GROUPS ISOLATED FROM EACH OTHER

BACKGROUND OF THE INVENTION

The present invention relates to dynamic random access memory devices and, more particularly, to a dynamic random access memory device which writes/reads data in units of multibits, for example, 8–32 bits.

In a dynamic random access memory (hereinafter referred to as a DRAM for simplifying purposes) having a memory capacity which is increased to replace a plurality of memory chips with a single memory chip to thereby decrease the space where the memory chips are otherwise attached, the memory tends to be accessed in units of multibits. One example of DRAMS where a memory is accessed in units of multibits is U.S. Pat. No. 5,029,330 issued to Kajigaya, Jul. 2, 1991.

In order to access a memory in units of multibits, memory blocks where a pair of memory blocks share a plurality of sense amplifiers, one provided for each of the bit lines, are required to be accessed in units of multibits. In this case, as shown by a geometric layout in FIG. 1 schemed by the present inventors with regard to their development of the present invention, the number of input/output lines I/O1–I/O8 connected via column switches with bit lines with which the memory cells are connected is required to be increased accordingly. When the number of such input/output lines increases, the size of the memory cell array would increase to ensure its wiring area. The respective column switches are controlled by a bit line selection signal delivered from column address decoder to a signal line YS1 or YS2.

SUMMARY OF THE INVENTION

It is one object of the present invention to provide a highly integrated and low power consumption DRAM where a memory is accessed in units of multibits.

According to one aspect of the present invention, in a dynamic random access memory device having a memory cell array which includes a first memory cell array part and a second memory cell array part portioned in a first direction parallel with the bit lines, a plurality of column switches, one provided for each of the bit lines, a plurality of input/output lines each connected to different ones of the bit lines via associated ones of the column switches, a row address decoder for decoding a first portion of an address signal to generate a word line selection signal to be applied to one of the word lines and a column address decoder for decoding a second portion of the address signal to generate a bit line selection signal to be applied to at least one of the column switches for bit lines in each of the first and second memory cell array parts to thereby simultaneously access at least two memory cells with the address signal, the above-mentioned input/output lines extending in a second direction parallel with word lines are divided into a first group of input/output lines connected to those bit lines which belong to the first memory cell array part and a second group of input/output lines connected to those bit lines which belong to the second memory cell array part, in which the first input/output line group is isolated from the second input/output line group. A first input/output gate circuit is connected to the first group of input/output lines and a second input/output gate circuit is connected to the second group of input/output lines, in which the first and second input/output gate circuits serve to selectively transfer therethrough, between main amplifiers and the first input/output line groups, data to be simultaneously read from or written into the at least two memory cells in the memory cell array.

BRIEF DESCRIPTION OF THE DRAWINGS

FIGS. 7A–7N are timing charts for illustrating the operation of a DRAM as one embodiment of the present invention.

DESCRIPTION OF THE PREFERRED EMBODIMENTS

One embodiment of the present invention will be described with respect to FIGS. 2, 3 and 5.

Figure 1:
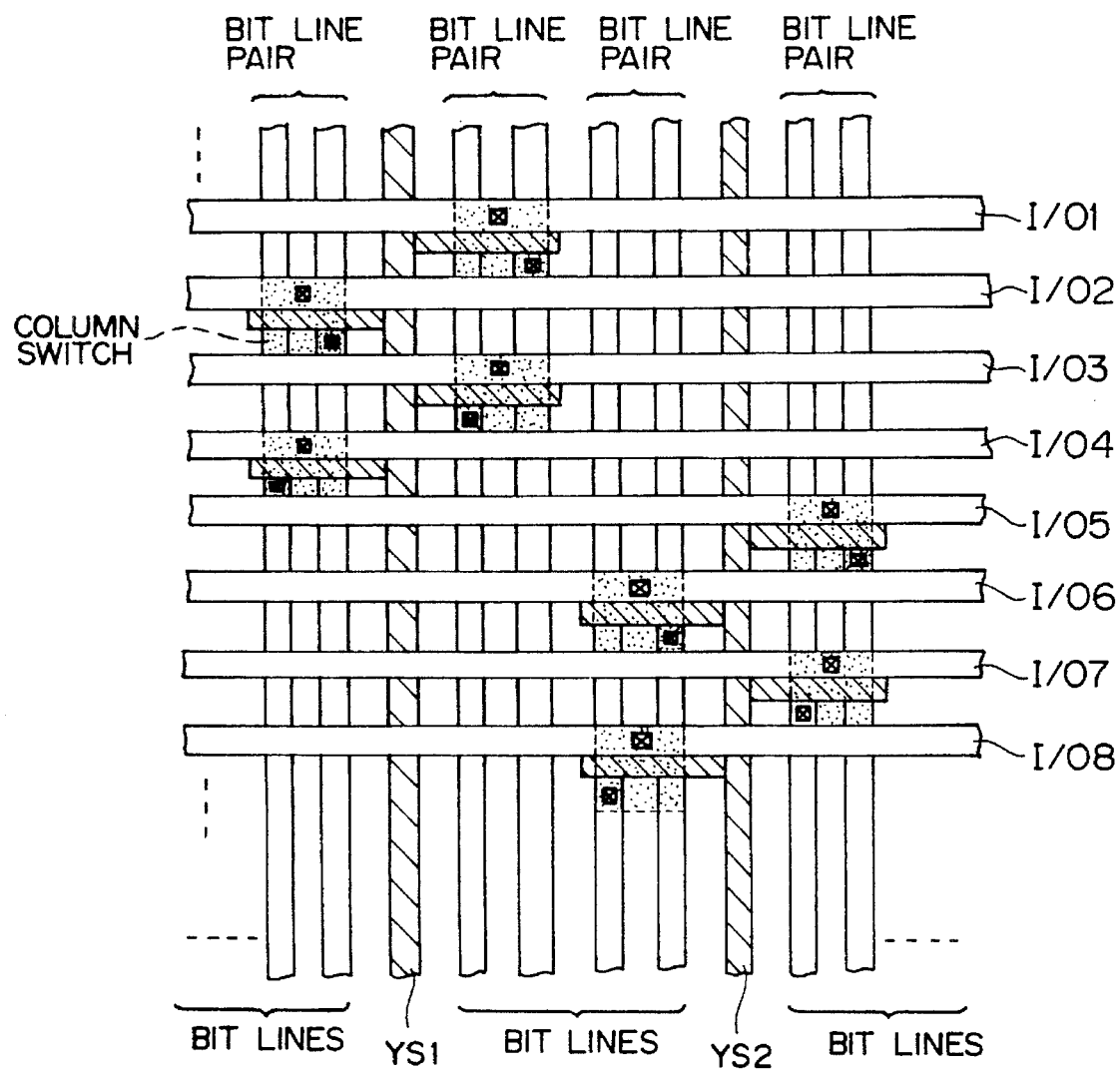
FIG. 1 shows a geometric layout of input/output lines schemed by the present inventors and usable in a conventional DRAM.
Figure 2:
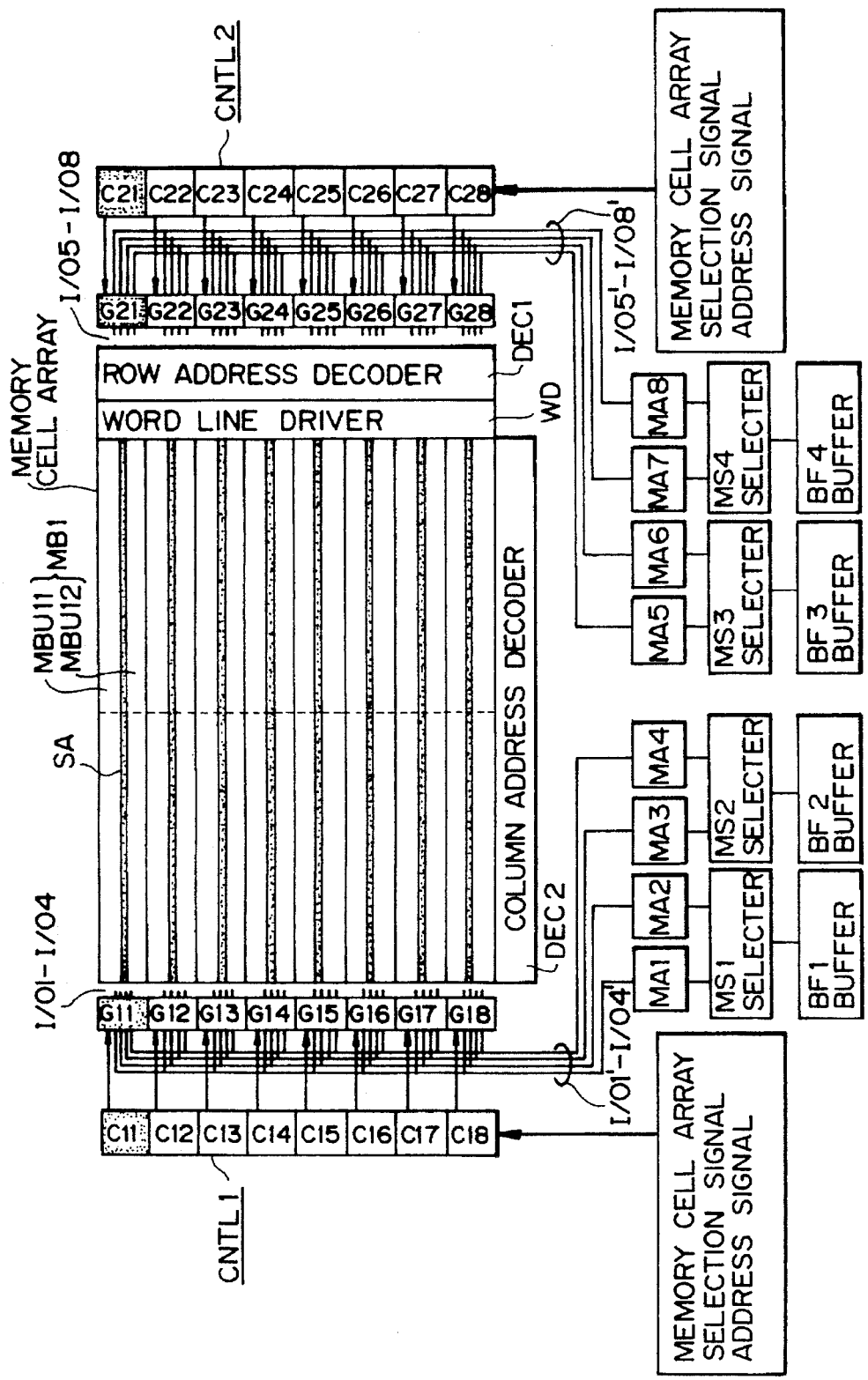
FIG. 2 shows the structure of a DRAM as one embodiment of the present invention.

FIG. 2 is a block diagram of one embodiment of one of a plurality of memory cell arrays included in a DRAM according to the present invention. FIG. 3 shows part of a geometric layout of input/output lines for the DRAM of FIG. 2. The respective circuit blocks of FIG. 2 are formed on a single semiconductor substrate of single crystal silicon in a conventional semiconductor integrated circuit manufacturing technique. The respective circuit and wiring conductors are depicted substantially to the actual geometric layout on the semiconductor substrate of FIG. 1.

The memory cell array includes eight memory blocks, for example. As shown in FIG. 5, one memory block MB1 includes a sense amplifier (SA1+SA2) and a pair of memory block units MBU11, MBU12 which have the sense amplifier (SA1+SA2) disposed therebetween. The memory cell array of this embodiment is of the a so-called shared sensing type where the single sense amplifier is shared by the pair of memory block units. The respective memory block units have a plurality of memory cells, one provided at each of cross points of word lines and bit lines which intersect substantially at right angles with each other. The respective memory block units have a first and a second memory block unit parts portioned in a first direction parallel with the bit line.

In each memory block unit, a word line extends parallel with the sense amplifier row (SA1+SA2) and has a word line selection circuit which includes a row decoder DEC1 which receives and decodes a portion of an address signal and a word line driver WD. In this embodiment, the word line selection circuit selects one word line for one memory array. Only a sense amplifier in a memory block in which the selected word line is provided is activated to amplify a data signal stored in a memory cell in the memory array with which the selected word line is connected to thereby write (rewrite; refresh) the amplified signal into the original memory cell. The bit line in each memory block is separated from that in another memory block.

Figure 3:
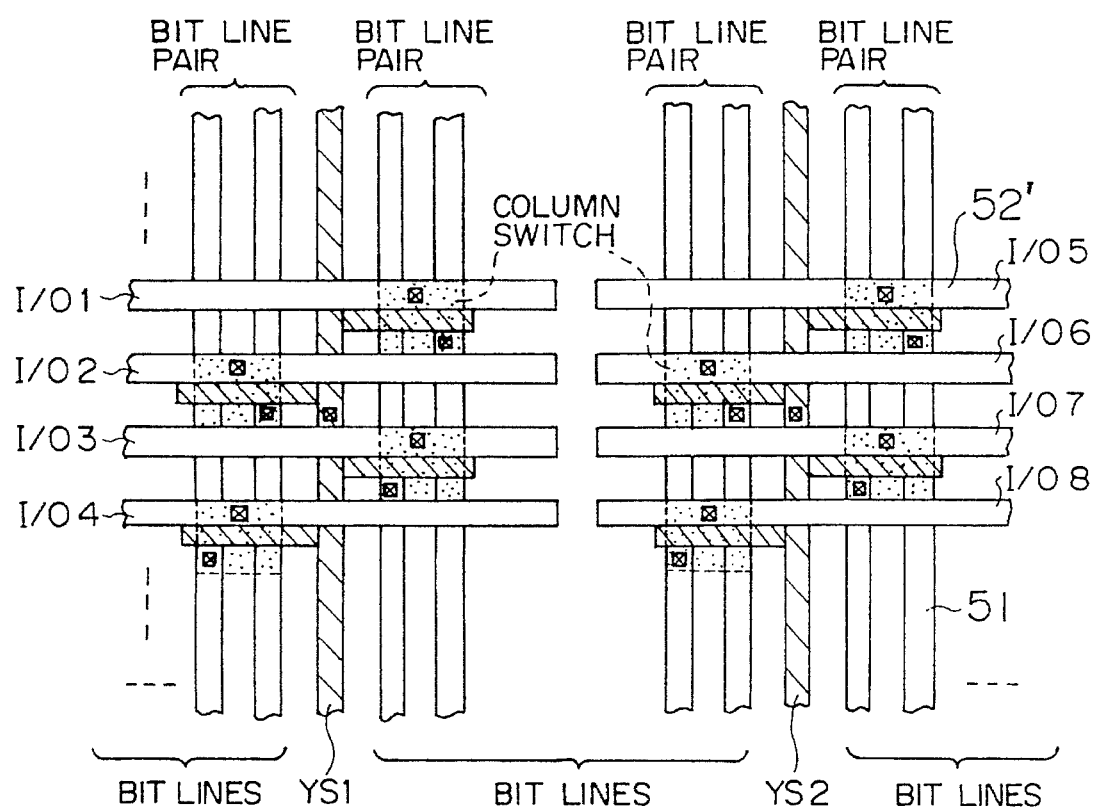
FIG. 3 shows a geometric layout of input/output lines for the DRAM of FIG. 2.
Figure 5:
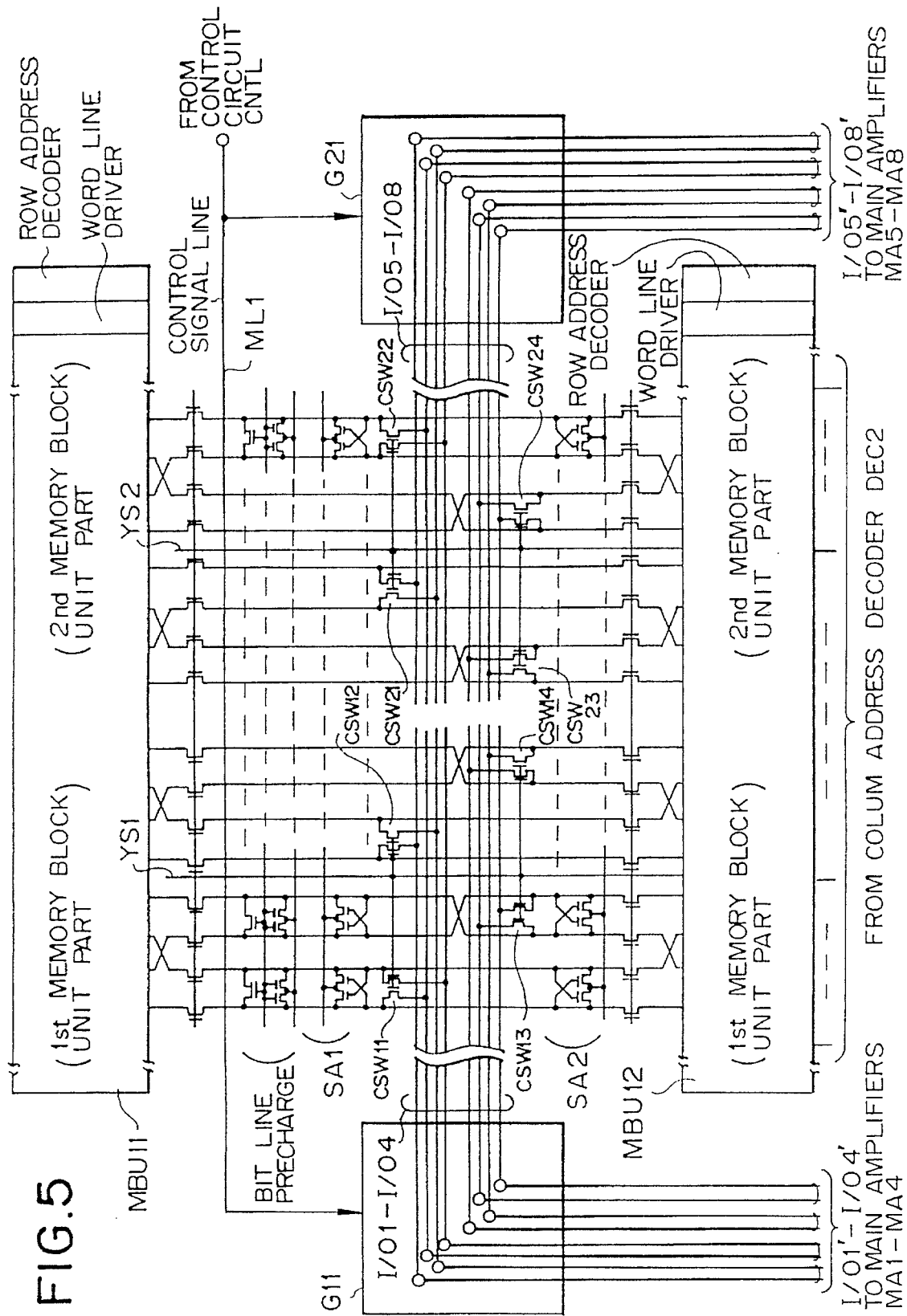
FIG. 5 shows the details of a part of the DRAMs of FIGS. 2 and 4.

In this embodiment, first input/output lines extending parallel with the sense amplifier in each memory block or in a second direction parallel with the word line are separated at the center of that memory block into two input/output line groups I/O1–I/O4 and I/O5–IO8, as shown in FIG. 2 (in broken lines) or FIGS. 3 and 5. As shown in FIG. 5, the respective input/output lines I/O1–I/O8 are connected to different bit lines through column switches CSW12, CSW11, CSW14, CSW13, CSW24, CSW23, CW22, CSW21. Thus, a space for (or the width of) each input/output line required in each memory block to access a memory in units of 8 bits from one memory cell array is reduced from that for 8 bits to that for 4 bits, as will be easily seen from comparison of FIGS. 1 and 3. As shown in FIGS. 2 and 5, input/output lines I/O1'–I/O4', I/O5'–I/O8' are provided which conduct data signals to (from) four memory cells to be accessed simultaneously in the respective right- and left-hand memory block unit parts of each memory block unit to main amplifiers MA1–MA4 to MA5–MA8 to thereby allow to access a memory in units of 8 bits, using a 4-bit wiring width. Since two signal lines, one for a true (non-inverted) signal and the other for a bar (inverted) signal, are required for a one bit signal, a space for sixteen signal lines is reduced to that for eight signal lines. As these input/output lines serve to conduct small amplitude signals, it is necessary to provide a large wiring space therefor in order to suppress noise influences. For example, the input/output lines may have a wiring pitch about ten times as large as that in the memory cell array. Thus, the above-described division of the input/output lines into two input/output line groups and isolation of the two groups from each other bring about a large effect of occupation area reduction.

As described above, the input/output lines are separated at the center of the memory cell array, but the word lines are not separated and extend from the side of the memory cell array where the word line driver is provided to the opposite side of the memory cell array. Similarly, a common source line with which a unit sense amplifier including a CMOS latch provided in correspondence to complementary bit lines in the memory cell array is connected extends through overall the length of the memory cell array without being separated (FIG. 5).

As shown in FIGS. 3 and 5, column selection lines YS1, YS2, ... are disposed in the memory cell array such that the column selection lines intersect at right angles to the word line to conduct a signal which selects a particular bit line. A column selection line is selected by a column address decoder DEC2 which receives and decodes a second portion of the address signal. The column address decoder DEC2 generates a select signal which renders conductive one of column switches CSW11, CSW2, ..., CSW21, ... for each bit line pair for each of the two separated first input/output line groups I/O1–I/O4, I/O5–I/O8. Thus, the column selection lines are selected one for the first and second memory block unit parts of each memory block unit where the two input/output line groups separated by the dotted line are provided.

A memory is accessed in units of eight bits, four bits for each of the two first input/output line groups, by selection of one word line and amplification of the sense amplifier in one memory block and selection of column selection lines, one for each of the first and second memory arrays in one memory cell array.

An input/output gate circuit including switches or input/output gates G11–G18, G21–G28 selectively connect the first input/output lines for each memory block with the second input/output lines I/O1'–I/O8' provided in correspondence to a memory cell array. Those switches are disposed on corresponding opposite sides of the memory cell array in correspondence to the separated first input/output line group. Second input/output lines for four bits are provided on each of the sides of the memory cell array through the switches so as to lead to main amplifiers (read/write amplifiers) MA1–MA8. The switches G11–G18, G21–G28 are controlled so as to turn on/off in accordance with control signals from control circuits CNTL1, CNTL2 which include gate controllers C11–C18, C21–C28, respectively. The control circuits CNTL1, CNTL2 generate the control signals based on the corresponding address signals.

The memory cell array has eight main amplifiers MA1–MA8. In this embodiment, one output selector MS1–MS4 is provided, for example, for two main amplifiers such that one output signal is selected to be delivered to buffers BF1–BF4. Thus, a read signal is outputted in units of 4 bits from one memory cell array to the outside of the DRAM.

The remaining 4-bit data is read at high speed solely by switching the output selector MS1–MS4. Although not especially limited, eight memory cell arrays shown in FIG. 2 are provided in the DRAM of this embodiment to allow access to a memory in units of 32 bits in all. Although not especially limited, one memory cell array has a storage capacity of about 8 Mbits to thereby cause the DRAM of this embodiment to have a large storage capacity of about 64 Mbits in all. Four of the eight memory cell arrays are selected in accordance with a select signal to write/read data of 16 bits.

Since two first separate input/output conductor groups in the same wiring area width, according to the present embodiment, are disposed in an aligning manner, the wiring area for the input/output lines is halved advantageously.

More particularly, when the input/output lines are, for example, separated in the vicinity of the center of one of a pair of memory blocks between which a sense amplifier is disposed, in order to access the one of the memory block in units of multibits, twice the number of input/output lines are disposed in the same wiring area width.

When in the DRAM the word line is put in a selected state, electric charges stored in many memory cells connected with the word line are read to the bit line. Thus, the data is required to be amplified by the sense amplifier and to be written into the DRAM. Even when a plurality of word lines is put in a selected state simultaneously in a plurality of memory blocks of a memory cell array, data can be read in units of multibits. In this case, the consumed current would increase as the number of sense amplifiers operated increases.

While in the second embodiment of FIG. 2 the area of the first input/output line group formed in the memory block is reduced in width, two switch control circuits are required to be provided which control the I/O switches G11–G18, G21–G28 which connect the two first input/output line groups I/O1–I/O4, I/O5–I/O8 with the two second input/output lines I/O1'–I/O8' connected with the main amplifiers. Provision of the two switch control circuits increases the wiring area for memory cell array selection signals and address signals delivered to the switch control circuits.

Figure 4:
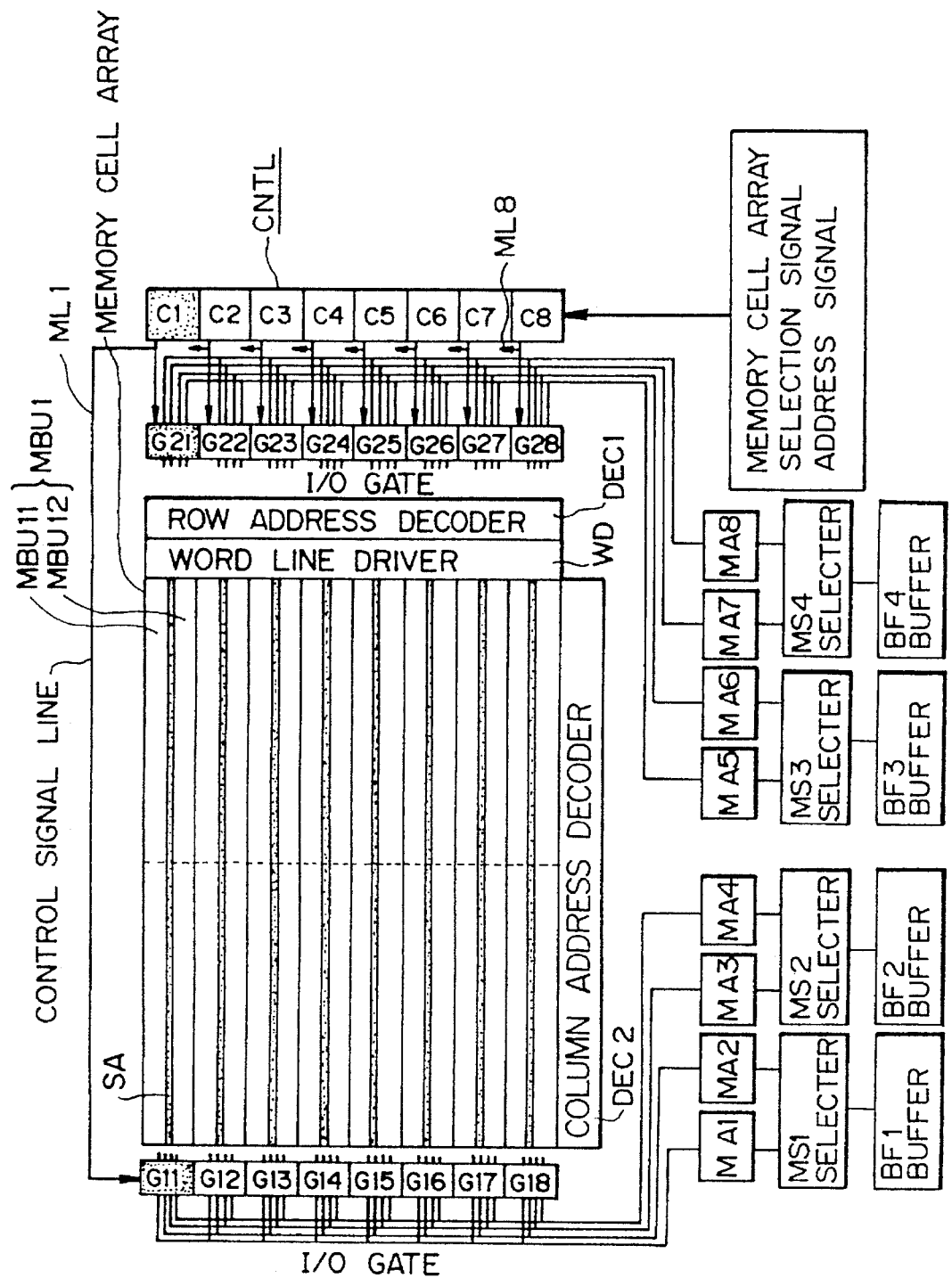
FIG. 4 shows the structure of a DRAM as another embodiment of the present invention.

In the embodiment of FIG. 4, a switch control circuit CNTL is provided only on one of the sides of the memory cell array to simplify the structure of the switch control circuit. The on/off operation of the two switch groups G11–G18, G21–G28 provided in correspondence to the separated first input/output line groups is performed by the control circuit CNTL. Thus, an I/O control signal generated by the switch control circuit CNTL is delivered to two switch groups provided on the corresponding opposite sides of the memory cell array.

The I/O control signal lines ML1–ML8 which control the switch group provided on the opposite side of the memory cell array from the switch control circuit CNTL are provided in an area between the memory block units in a direction parallel with the word lines corresponding to the I/O control signals ML1–ML8. In this case, although not especially limited, the area where the sense amplifier row is provided is used. In FIG. 4, although the I/O control signal is depicted so as to extend outside the memory cell array in order to facilitate the understanding of the invention, it is formed actually along the sense amplifier row (see control signal line ML1 in FIG. 5).

The sense amplifier row is provided in the wiring area where MOSFETS which compose the CMOS latch, its common source line and the first input/output line group are disposed. The I/O control lines ML1–ML8, one for each memory block, are provided in that wiring area.

In the embodiment of FIGS. 4 and 5, in order to simplify the scale or structure of the switch control circuit, a single switch control circuit is provided on one side of the memory cell array unlike the arrangement where the two switch control circuits are provided on the corresponding opposite sides of the memory cell array. Since the switch control circuit is further supplied with a memory cell array select signal and an address signal to select a memory block, one of wiring areas such as both the wiring areas provided on the corresponding opposite sides of the memory cell array of the embodiment of FIGS. 1–3 is eliminated through which wiring areas the select signal and address signal are provided to the memory cell array. As a result, the chip size of the DRAM is reduced.

Figure 6:
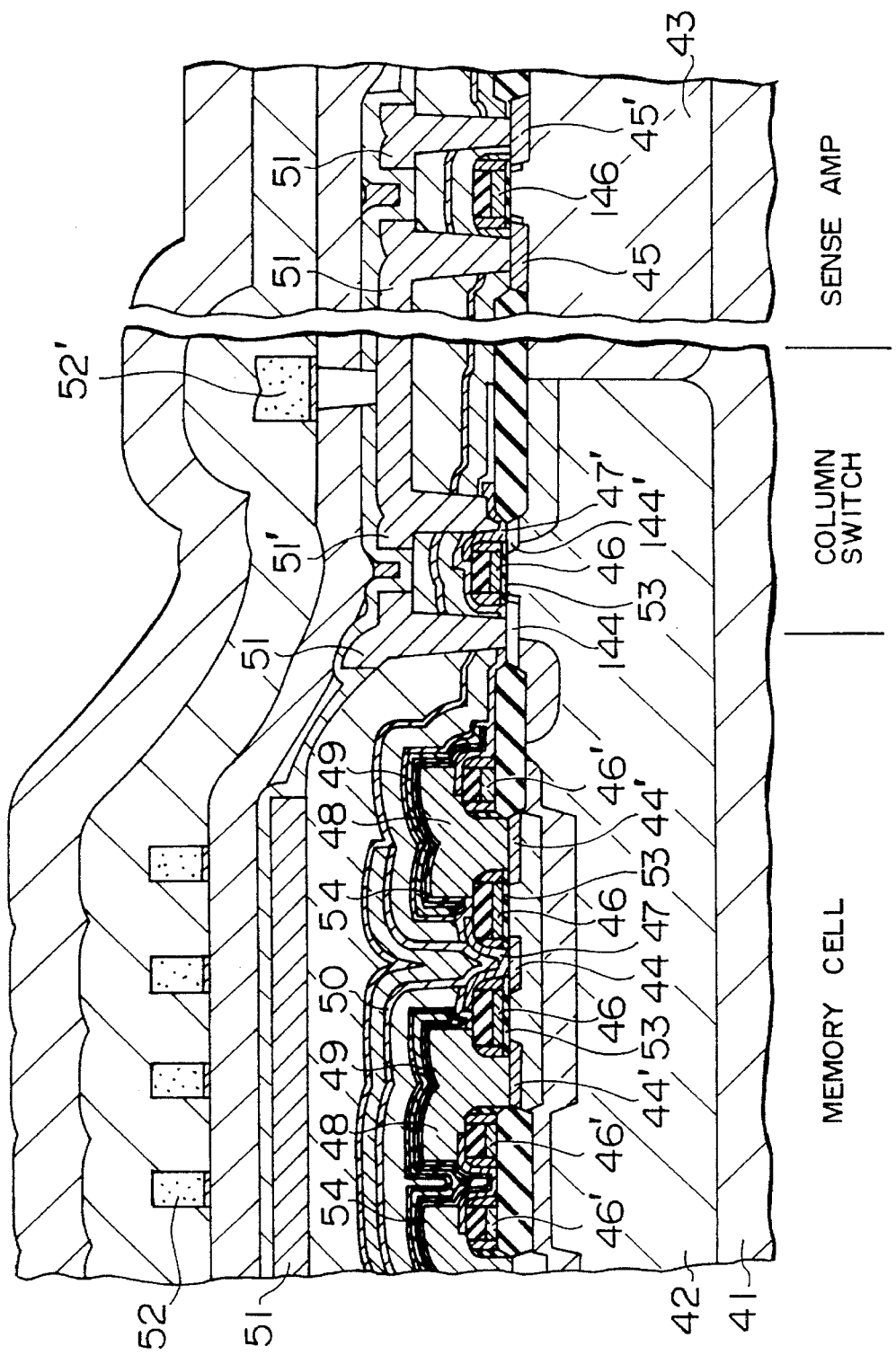
FIG. 6 is a cross-sectional view of the structure of a memory cell and its periphery of the memory array of FIG. 4.

FIG. 6 is a diagrammatic cross-sectional view of a DRAM which includes a memory cell of the memory cell array, a n-channel column switch MOSFET which selects a bit line, and a p-channel MOSFET used in a CMOS latch (sense amplifier), taken along the direction of extension of a bit line.

A memory cell and an n-channel MOSFET which composes a column switch are formed on a p-type well 42 which is, in turn, formed on a p-type substrate 41. In FIG. 6, a pair of memory cells is provided for a bit line 50 of polycide. More particularly, a pad contact 47 of a conductive polysilicon is provided in a contact hole formed by a self-alignment technique for a common drain 44 of address selection MOSFETS which compose a pair of memory cells.

Sources 44' connected with corresponding information storage capacitors are provided on the corresponding right- and left-hand sides of the common drain 44. A gate electrode 46 which constitutes a conductive polysilicon word line is provided through a thin gate isolating film 53 between both the areas 44 and 44'. The word line is word-strapped with an aluminum layer 52 formed thereover. FIG. 6 also illustratively shows a word line 46' connected with an address selection MOSFET gate of another memory cell whose arrangement pitch deviates from a reference point. Those word lines 46' are formed on a relatively thick field isolating film.

The source 44' connected with the capacitor of the MOSFET which composes the memory cell is connected with a conductive polysilicon layer 48 which composes a store node of the capacitor. A polysilicon film 49 which composes a plate electrode of the capacitor is provided through a thin isolating film 54 on the polysilicon layer 48.

Provided on the bit line 50 is a tungsten layer 51 as a first metal layer which forms the column select line. Although not especially limited, the polycide layer 50 which composes the bit line is omitted in FIG. 6, but connected with the tungsten layer 51 through selection switch MOSFETS arranged in a shared sensing type and also connected with one source 144 of the MOSFET which composes the column switch. A drain 144' of the MOSFET which composes the column switch is connected with the first input/output (I/O) line made of a second aluminum layer 52' through a pad contact 47' and a first metal layer 51' like the MOSFET which composes the memory cell, as mentioned above.

FIG. 6 shows an example of a p-channel MOSFET used in the CMOS latch which composes a sense amplifier in the right-hand end thereof. The p-channel MOSFET which includes a source 45, a drain 45' and a gate 146 is formed in an n-type well 43. Other p-channel type MOSFETS of the peripheral circuit are formed in similar n-type wells.

In this embodiment, a pad contact 47' similar to that of the address selection MOSFET for the memory cell is used as a drain of an n-channel MOSFET which composes a column switch connected with the first input/output line, the drain of the n-channel MOSFET being connected with the first input/output line. In this structure, a self-alignment technique may be used to form a contact hole formed in an oxide film on the drain surface to thereby eliminate the need for forming a large hole in consideration of a possible deviation of a mask for formation of the contact hole in the drain below the pad contact 47'. Thus, since a minimum necessary hole is formed as shown in FIG. 6, high circuit integration is achieved and stray capacitance is reduced.

When the drains (sources) of many column switch MOSFETS are connected with the first input/output line 52', the whole stray capacitance inherent to the MOSFETS is greatly reduced as the stray capacitance inherent to the drains (sources) of the column switch MOSFETS is reduced. The wiring capacitance of the first input/output line is greatly reduced. Thus, the signal transmission speed and the write and read speeds increase.

MOSFETS which use pad contacts such as are mentioned above include a column switch MOSFET such as is mentioned above, a MOSFET which composes a sense amplifier, a bit line precharging MOSFET, a MOSFET which selects a shared sensing amplifier, and a word line driver FET. The MOSFETS are usable in circuits which require fining and reduction of stray capacitance.

In this embodiment, the I/O control signals are transmitted through the memory cell array in the direction of word line extension on conductors parallel with the input/output lines 52' and composed of aluminum formed in the same second level as the input/output line 52'.

FIGS. 7A–7N are a timing chart explaining one example of the operation of the inventive DRAM. A row address strobe signal $\overline{RAS}$ is rendered low, at which timing an input address signal ADD (AX) is input as an X address to a low address buffer. Since the row address signal is fixed due to the signal $\overline{RAS}$ being low, the memory cell array selection signal MSi is formed.

Substantially synchronously with the memory cell array selection signal MSi, an I/O control signal is rendered low which turns on a switch (I/O gate) provided in correspondence to a memory block to be selected. A signal corresponding to an unselected memory block remains high, as shown by a dotted line in FIGS. 7A–7N. Thereafter, a word line to be selected is rendered high (WL), so that a small signal corresponding to the stored information appears on the bit line DL of the memory block. In response to a sense amplifier activating signal SPN/PP, the sense amplifier amplifies the small signal. Thus, the selected memory cell is rewritten such that the original storage charges are recovered in the capacitor.

Subsequently, the column address strobe signal $\overline{CAS}$ is rendered low, at which timing the input address signal ADD(AY) is fetched as a column address into a column address buffer (not shown). When the signal $\overline{CAS}$ is rendered low, the signal $\overline{WE}$ is high ("H"), so that a read mode is determined. The column switch is opened with the column selecting timing signal YS, so that a read signal corresponding to the voltage level of the bit line appears on the first input/output line I/O. A main amplifier operation timing signal MPN/SN causes the main amplifier MA to operate to amplify the signal read on the input/output line I/O. A data output timing signal DOC activates the output buffer to output a read signal Dout from its output terminal.

Each I/O control signal line is formed so as to pass through an area where the sense amplifier which amplifies a small signal is formed. Since an I/O control signal, when finally determined as being selected in connection with the selected/unselected states, is rendered low with an early timing of operation of the row addressing, as mentioned above, there is sufficient time until a column switch is selected. Thus, even when a signal is transmitted on a long wiring conductor through the memory cell array, there is no problem in operation. At the timing of operation of the sense amplifier or when the read signal is output on the input/output line, the I/O control signal is clamped to a fixed level where no change occurs, and hence does not influence those operations at all.

The above-described embodiments enjoy the following advantages:

(1) A pair of input/output gate circuits is provided one on each of the opposite sides of a memory cell array having first input/output lines separated at their center such that the input/output gate circuits select and connect the respective first input/output lines with the corresponding second input/output lines which lead to the inputs of the main amplifiers and to the outputs of the write amplifiers. A switch control circuit is provided on one of the sides of the memory cell array to control both the input/output gate circuits and selects at least one column switch in correspondence to each of the separated first input/output lines. Since in this arrangement two wiring conductor groups separated so as to have the same width of the wiring area are disposed so as to align in a single straight line, the wiring conductor area for the input/output lines in the memory block is halved and the switch control circuits therefor are simplified.

(2) A wiring conductor which transmits a selection signal (I/O control signal) delivered to the input/output gate provided on the opposite side of the memory cell array from the switch control circuit is formed adjacent the first input/output line and of the same material as the first input/output line for efficient formation of the wiring conductor.

(3) The plurality of input/output lines and the I/O control lines may be disposed in the input/output section of the sense amplifier where the shared selection switch MOSFET and the column switch are required to be provided in the shared sensing amplifier system.

While the present invention has been described specifically by way of an embodiment thereof, the present invention is not limited to the particular embodiment and various changes and modifications are possible without departing from the spirit and scope of the present invention. For example, in FIG. 2 or 4, the arrangement may be such that a single switch control circuit is provided between two pairs of right- and left-hand memory cell arrays to control four input/output gates, two of which are provided on each of both the sides of the two memory cell arrays. In this arrangement, the number of switch control circuits is halved. The actual structure of a memory cell array or a memory block of a DRAM may employ various forms of implementation.

The present invention is widely applicable to DRAMS in which a memory is accessed in units of multibits in a memory cell array. The DRAM may be provided in a digital integrated circuit.

We claim:

1. A dynamic random access memory device comprising:

a memory cell array including a plurality of memory blocks each having a plurality of memory cells provided at crossing points between word lines and bit lines extending substantially perpendicular to each other, each of said memory blocks including a first memory block part and a second memory block part portioned in a first direction parallel with said bit lines, the bit lines in any one of said memory blocks being isolated from the bit lines in other ones of said memory blocks;

a plurality of column switches, one provided for each of said bit lines in each of said memory blocks;

a predetermined number of first input/output lines provided for each of said first and second memory block parts of each of said memory blocks, each of said predetermined number of first input/output lines being connected to different ones of said bit lines via associated ones of said column switches in each of said memory blocks, said predetermined number of first input/output lines for said first memory block part and said predetermined number of first input/output lines for said second memory block part extending in a second direction parallel with said word lines and being isolated from each other in each of said memory blocks;

a row address decoder for decoding a first portion of an address signal to generate a word line selection signal to be applied to one of said word lines and a column address decoder for decoding a second portion of said address signal to generate a bit line selection signal to be applied to at least one of the column switches for the bit lines in each of said first memory block part and said second memory block part of one of said memory blocks to thereby simultaneously access at least two memory cells in said one memory block with said address signal to transfer data signals between said at least two memory cells and said predetermined number of first input/output lines for the first and second memory block parts of said one memory block, the number of said memory cells to be simultaneously accessed being the same as said predetermined number;

a first input/output gate circuit including a plurality of first input/output gates, one first input/output gate being provided for each of said memory blocks, the first input/output gate associated with each of said memory blocks being connected to said predetermined number of first input/output lines for the first memory block part of the memory block, and a second input/output gate circuit including a plurality of second input/output gates, one second input/output gate being provided for each of said memory blocks, the second input/output gate associated with each of said memory blocks being connected to said predetermined number of first input/output lines for the second memory block part of the memory block;

a switch control circuit for producing, on a basis of said signal address a control signal for controlling said first and second input/output gate circuits, said switch control circuit being electrically connected in common to said first and second input/output gate circuits so that the first input/output gate and the second input/output gate of a respective memory block are simultaneously closed;

a predetermined number of second input/output lines connected in common to said first input/output gates, and a predetermined number of third input/output lines connected in common to said second input/output gates; and first main amplifiers connected to said second input/output lines and second main amplifiers connected to said third input/output lines, said first and second input/output gates for each of said memory blocks, when simultaneously closed by said control signal, serving to transfer data signals between the first input/output lines for the first memory block part of the memory block and said second input/output lines and transfer data signals between the first input/output lines for the second memory block part of the memory block and said third input/output lines so that said data signals on said second and third input/output lines are amplified by said first and second main amplifiers, respectively.

2. A dynamic random access memory device according to claim 1, wherein:

said first and second input/output gate circuits are arranged on opposite sides of said memory cell array for the connection between said first gates and said first input/output lines for said first memory block parts and for the connection between said second gates and said first input/output lines for said second memory block parts., respectively.

3. A dynamic random access memory device according to claim 1, wherein:

each of said memory blocks has a pair of memory block units each including a first memory block unit part and a second memory block unit part portioned in said first direction, the first memory block unit parts of said pair of memory block units forming the first memory block part in each of the memory blocks, the second memory block unit parts of said pair of memory block units forming the second memory block part in each of the memory blocks, and a sense amplifier is provided for each of the bit lines in each of said memory blocks, the sense amplifiers in each of said memory blocks being shared by the pair of memory block units in corresponding ones of said memory blocks.

4. A dynamic random access memory device according to claim 2, wherein:

each of said memory blocks has a pair of memory block units each including a first memory block unit part and a second memory block unit part portioned in said first direction, the first memory block unit parts of said pair of memory block units forming the first memory block part in each of the memory blocks, the second memory block unit parts of said pair of memory block units forming the second memory block part in each of the memory blocks, and a sense amplifier is provided for each of the bit lines in each of said memory blocks, the sense amplifiers in each of said memory blocks being shared by the pair of memory block units in corresponding ones of said memory blocks.

5. A dynamic random access memory device according to claim 4, wherein the memory device is formed at a principal surface of a semiconductor substrate, in which said first input/output lines for both said first memory block part and said second memory block part are disposed above a portion of the principal surface of said semiconductor substrate covering an area between the respective pairs of memory block units of each of said memory blocks.

6. A dynamic random access memory device according to claim 5, wherein said switch control circuit includes a plurality of gate control units, each of which produces an output signal for selectively simultaneously controlling the first input/output gate and the second input/output gate of a respective one of said memory blocks, each said output signal being transmitted via a respective control signal line to said first and second input/output gates associated therewith, each said control signal line being extended in said second direction at a part of the principal surface of said semiconductor substrate interposed between the areas associated with the respective memory block units of an associated memory block.

* * * * *